United States Patent [19]
Landers et al.

[11] Patent Number: 5,502,404
[45] Date of Patent: Mar. 26, 1996

[54] GATE ARRAY CELL WITH PREDEFINED CONNECTION PATTERNS

[75] Inventors: Robert J. Landers, Plano; Shivaling S. Mahant-Shetti, Dallas, both of Tex.; R. Krishman; C. Mutukrishnan, both of Ganganagar, Ind.

[73] Assignee: Texas Instruments Incorporated, Dallas, Tex.

[21] Appl. No.: 431,233

[22] Filed: Apr. 28, 1995

[51] Int. Cl.⁶ .......................... H01L 25/00; H03K 19/173
[52] U.S. Cl. .................... 326/50; 326/41; 326/45
[58] Field of Search .................. 326/41, 45, 50; 257/204, 206

[56] References Cited

U.S. PATENT DOCUMENTS

| | | | |
|---|---|---|---|
| 4,745,307 | 5/1988 | Kitamura | 307/468 |
| 4,771,327 | 9/1988 | Usui | 357/45 |
| 4,785,199 | 11/1988 | Kolodny | 307/202.1 |
| 5,055,716 | 10/1991 | El Gamal | 357/45 |
| 5,391,943 | 2/1995 | Mahant-Shetti | 326/41 |
| 5,422,581 | 6/1995 | Mahant-Shetti | 326/50 |
| 5,428,255 | 6/1995 | Wall | 326/45 |

*Primary Examiner*—Edward P. Westin
*Assistant Examiner*—Andrew Sanders
*Attorney, Agent, or Firm*—John D. Crane; James C. Kesterson; Richard L. Donaldson

[57] ABSTRACT

A base cell for a CMOS gate array is provided with a plurality of N-channel transistors 10, 12, 14 with all such N-channel transistors coupled in series. A plurality of P-channel transistors 16, 18 coupled in series. These transistors are interconnected at the transistor level to form a partially prewired circuit. Specifically, the gates of two of the N-channel transistors 12, 14 are connected by polysilicon lead 28 to the gate of transistor 16. This configuration forms a circuit primitive which is well adapted for use as a base cell in a programmable array device.

10 Claims, 3 Drawing Sheets

[5,502,404]

GATE ARRAY CELL WITH PREDEFINED CONNECTION PATTERNS

FIELD OF THE INVENTION

This invention relates broadly to the field of gate arrays and particularly to a gate array having an architecture based on utilizing a cell having a plurality of partially prewired circuits as the principal building block for creating both simple and complex logic functions including the multiplexer function.

BACKGROUND OF THE INVENTION

Traditional gate array base cells have evolved around efficient layout of transistor arrays. This has been due in part to the number of gates that can be formed in the array and in part due to the number of input/output pins the array has. As circuits have become smaller allowing more gates to be put on a single chip, it has been important to stress development of functions using programmable metal layers. This approach has been used in developing memory circuits, digital signal processing circuits, logic functions such as adders and the like and is based on having transistors available to form NAND gates, AOI cells, inverters, memory cells and the like.

The programmable metal used to produce the desired functions takes up a good deal of available space and has caused, especially in chips with very high integration, a reduction in the density of functions that can be formed. As a result, the typical wiring inefficiency for a given array has resulted in as many as 40% of the base cells on the chip not being utilized in the final circuit configuration. The inability to wire up desired functions in a single gate array, however, has increased the cost of utilizing this technology by increasing area required to perform a given function, thus wasting the components which could not be wired.

Another factor which has contributed to reduced efficiency in wiring gate array cells is the fact that the cells themselves have been frequently based on having the transistors available to form 2 input NAND circuits which has heretofore been thought to be quite flexible. However, an investigation of sequential logic functions and data signal processing functions has demonstrated that there is a high frequency of multiplexer circuits in such logic and that the multiplexer has proved to be somewhat difficult to implement in the numbers desired by designers because wiring routing channels are quickly used up.

SUMMARY OF THE INVENTION

The present invention is a CMOS array base cell which is designed to overcome the above mentioned and other problems with prior art base cells and utilizes a plurality of N-type and P-type transistors. At least two of the P-type transistors are connected together in series with the connection point between them being accessible for connection by programmable wiring. In addition, at least three N-type transistors are connected together in series with the connection point between the second and third N-type transistor being accessible for connection by programmable wiring. The gate of one of the P-type transistors is wired in polysilicon to the gate of the second and third N-type transistor. These interconnected transistors form the basic building blocks for the logic functions that can be implemented using the array cell of the present invention.

The total number of transistors and their interconnections makes the present base cell very useful in producing numerous functions including a flip-flop circuit.

DESCRIPTION OF THE DRAWINGS

The above mentioned advantages and features of the present invention are described below in greater detail in connection with the drawings which form a part of the disclosure wherein.

DETAILED DESCRIPTION

Figure 1:
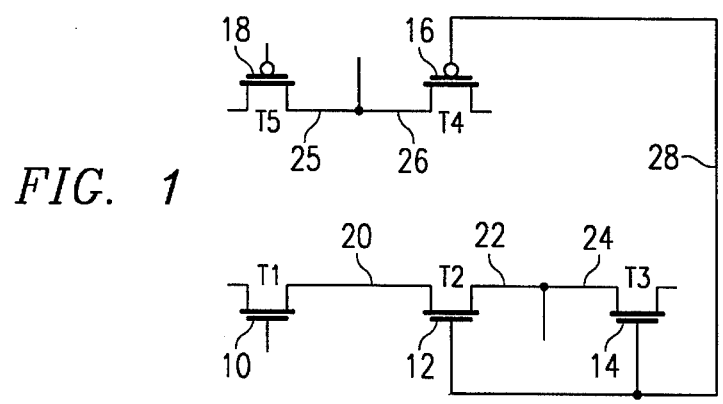
FIG. 1 illustrates a schematic diagram of the partially prewired base cell of the present invention.

Referring first to FIG. 1, a circuit diagram of the base cell of the present invention is illustrated. The circuit of FIG. 1 includes a plurality of series connected N-channel transistors 10, 12, 14 The circuit of FIG. 1 also includes a plurality of series connected P-channel transistors 16, 18. The transistors 10, 12 and 14 are connected in series in silicon as indicated at 20, 22 and 24. The transistors 16 and 18 are connected in series in silicon as indicated at 25 and 26. The connection point between points 25 and 26 comprises a circuit location which may be connected to an external power source typically referred to as $V_{cc}$. The connection point between points 22 and 24 may also be connected to an external power source which is typically referred to as $V_{ss}$. In addition, the base cell of FIG. 1 also includes a polysilicon lead 28 connecting the gates of transistors 16, 14 and 12.

Figure 2:
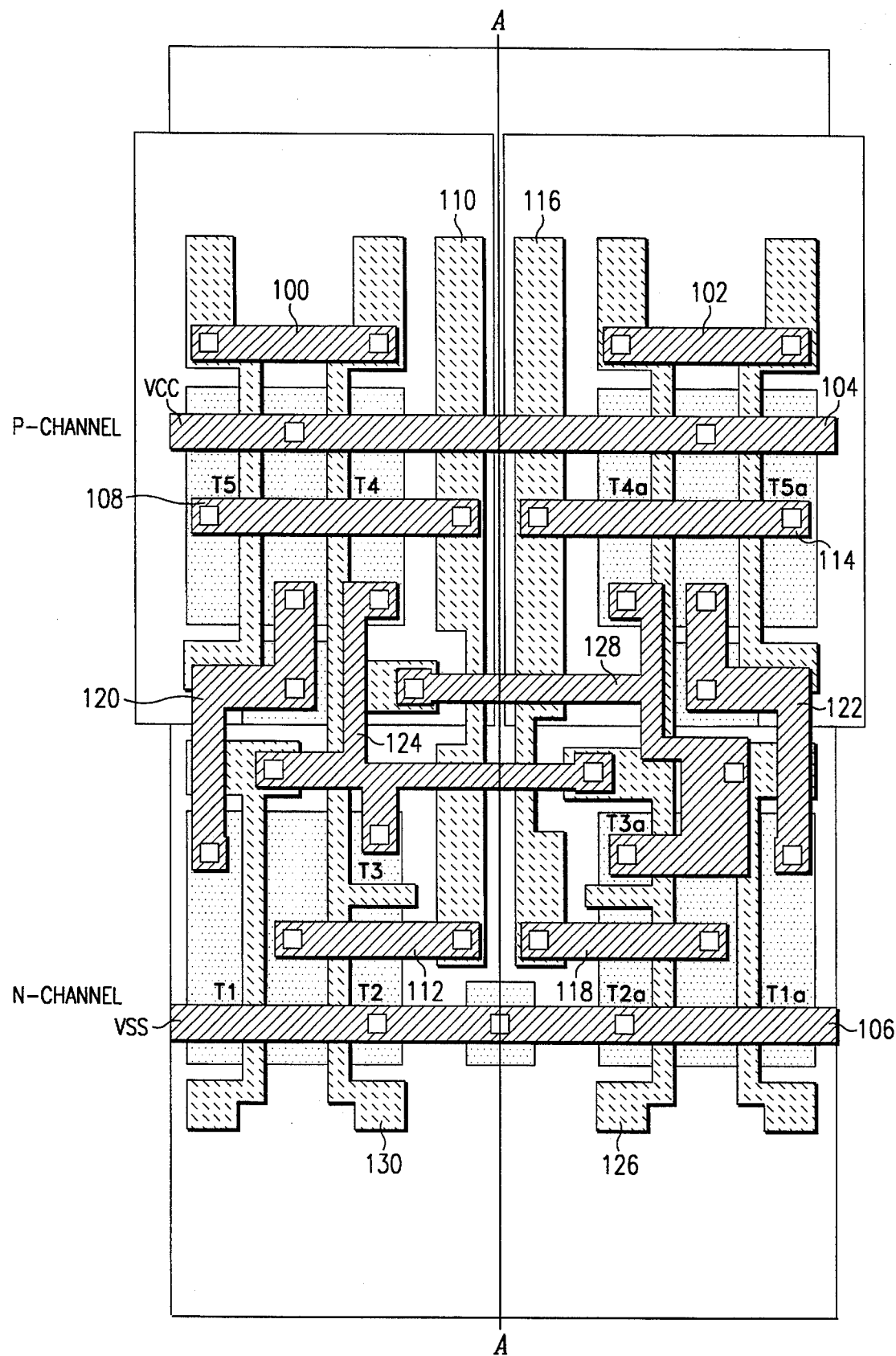
FIG. 2 illustrates how two base cells can be connected together with first level wiring to form a flip-flop.

Referring now to FIG. 2, two base cells are shown side-by-side with one base cell being disposed to the left of the line A—A and a second base cell disposed to the right of that line. These two cells are very similar in configuration and approximating in many aspects mirror images of each other. These two base cells are wired using first level wiring into a flip-flop configuration. The first level wiring has shading of wire 100 which connects the gate of transistor T5 to the gate of transistor T4. In addition first level wiring 102 is provided to connect the gate of transistor T4a to the gate of transistor T5a. First level wiring 104 is provided to connect the junction between transistors T4 and T5 with the junction between transistors T4a and T5a. This wire 104 will provide the mechanism for connecting transistors T4, T5, T4a, and T5a with the supply voltage $V_{cc}$. A further first level wire 106 connects the junction between transistors T2, T3, T2a and T3a to the supply voltage $V_{ss}$.

A first level wire 108 is provided to couple the source/drain of transistor T5 to the polysilicon lead 110. This lead 110 is coupled by a first level wire 112 to the connection point between transistor T1 and T2. A similarly configured first level wire 114 is provided to couple the source/drain of transistor T5a to the polysilicon lead 116. This lead 116 is coupled by a first level wire 118 to the connection point between transistor T1a and T2a.

Another first level wire 120 provides a connection between the junction between transistors T5 and T4 and the source/drain of transistor T1. A similarly configured first level wire 122 provides a connection between the junction between transistors T5a and T4a and the source/drain of transistor T1a. A first level wire 124 provides a connection between the source/drain of transistor T4, the source/drain of transistor T3, the gate of transistor T1, and the polysilicon lead 126 which connects the gates of transistors T2a, T3a, and T4a together. A first level wire 128 provides a connection between the source/drain of transistor T4a, the source/drain of transistor T3a, the gate of transistor T1a, and the polysilicon lead 130 which connects the gates of transistors T2, T3 and T4 together.

The configuration of the base cells illustrated in FIG. 2 is drawn to scale although it is many times larger than the actual size in which the polysilicon leads would typically have a lead width in the range of approximately 0.6 to 0.8 microns. From this scale figure it can be determined that the width of P-type transistors T4 and T5 is approximately the same as the width of N-type transistor T1. As P-type transistors do not function in the same manner as N-type transistors, one would expect the current switching capacity of the transistors T4 and T5 to each be approximately ½ the current switching capacity of transistor T1. In addition, it is noted that transistor T2 is about 60% of the width of transistor T1. As such, transistor T2 will have a current carrying capacity of approximately 60% that of the highest current carrying capacity N-channel transistor T1. T3 is even smaller in width than T2 and is approximately 20% of the width of T1 and about 35% the width of transistor T2. As such, T3 will have a current carrying capacity of approximately 20% that of transistor T1. The particular size relationships between the transistors discussed above is for the particular design illustrated in FIG. 2 which is a highly flexible design. Those of skill in the art will realize that other size relationships between the transistors may also be utilized. Indeed, the current carrying capacity of all the transistors could be identical. However, as the current carrying capacity of the transistors is altered from that specified above, the physical layout of the cell may need to be changed which may affect the usefulness of the cell as it may become more difficult to wire the cell in the number of desired configurations that the present cell can be wired.

Figure 3:
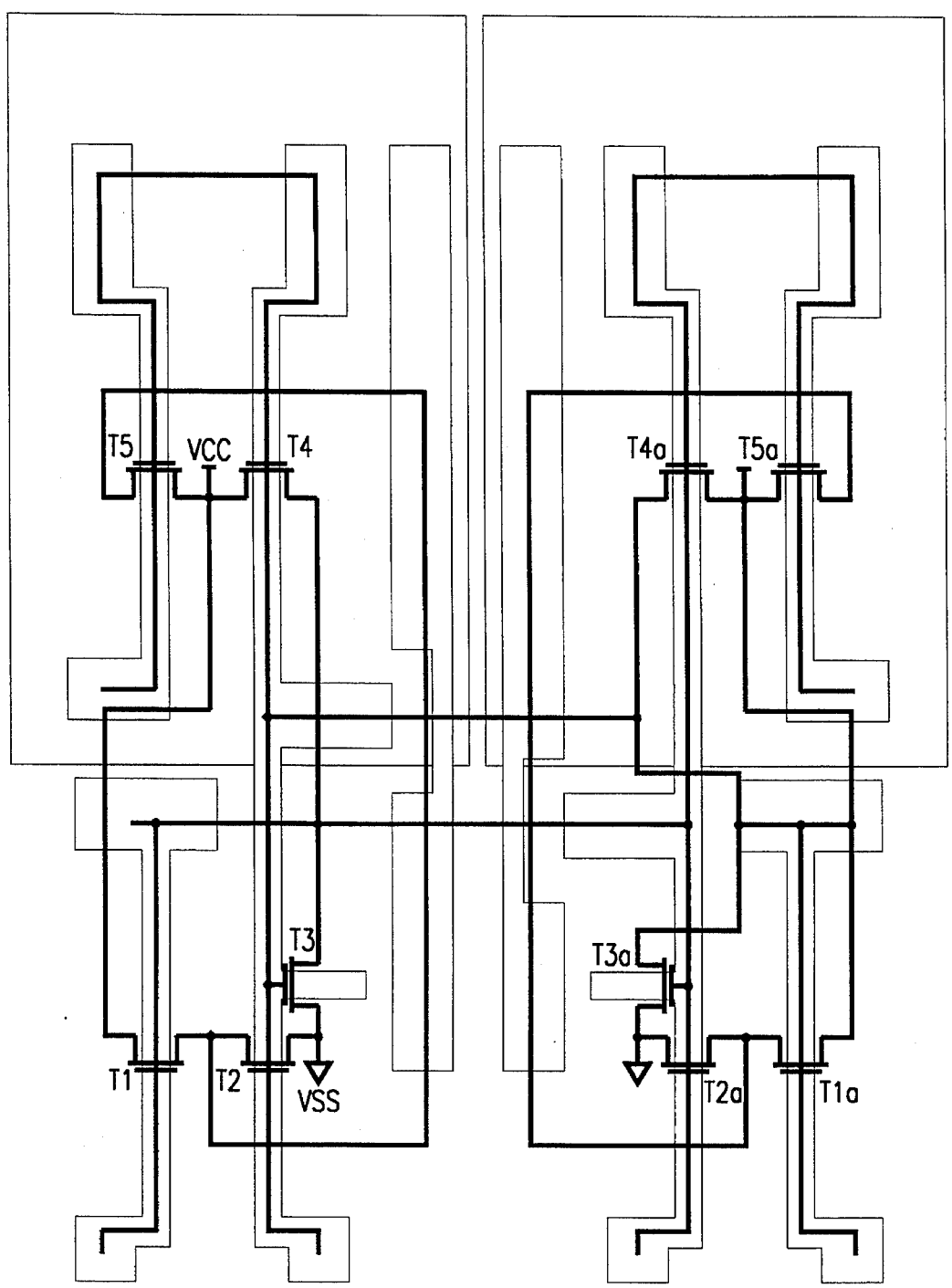
FIG. 3 illustrates the circuit diagram for the flip-flop of FIG. 2 along with a symbolic representation as to where programmable (first level) wiring is located.

FIG. 3 illustrates the circuit diagram formed by the two base cells and first level wiring of FIG. 2.

Figure 4:
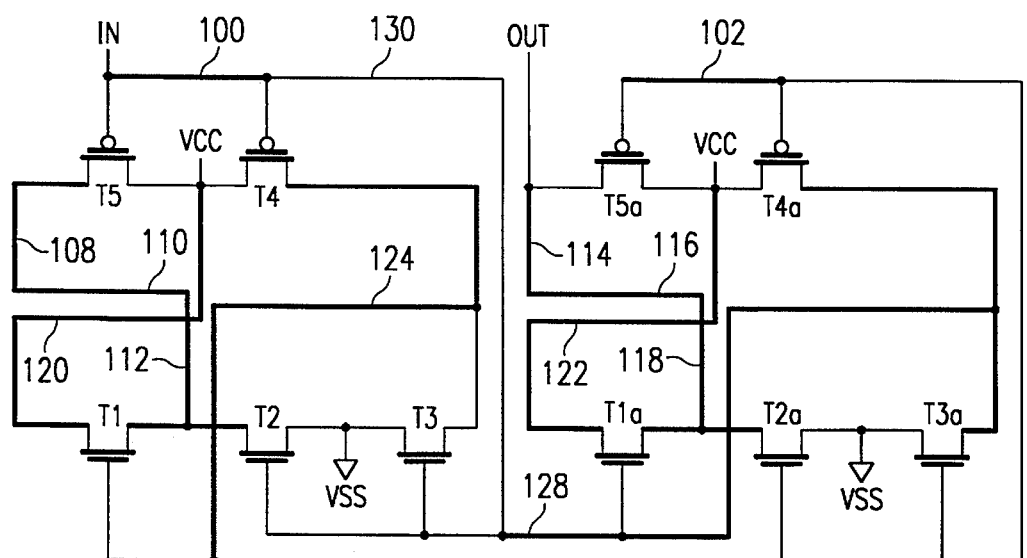
FIG. 4 is a complete circuit diagram of the structure illustrated in FIG. 2.

FIG. 4 comprises a circuit diagram for the flip-flop illustrated in FIG. 2. First level wiring is illustrated by lines having the width of first level wire 100. Polysilicon wiring is illustrated in FIG. 4 with lines having the width of polysilicon lead 130. Leads of corresponding number in FIG. 4 and FIG. 2 are the same lead with the lead in FIG. 2 illustrating its physical location and that in FIG. 4 illustrating its position in the circuit diagram.

Figure 5:
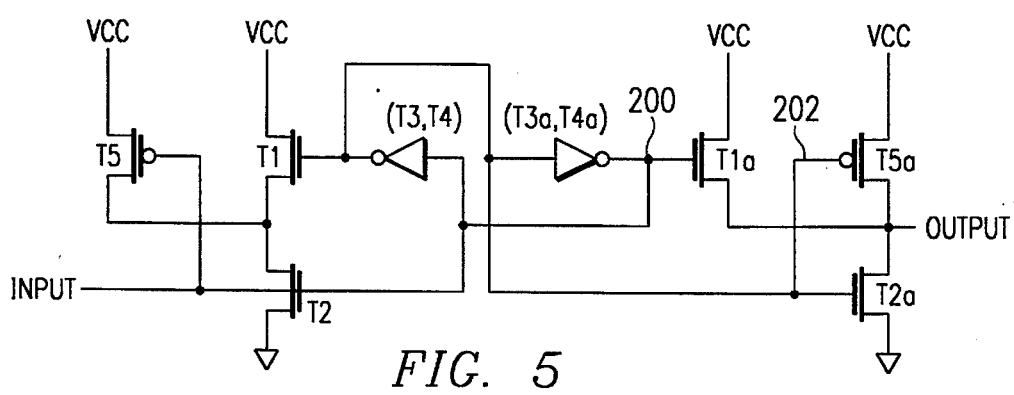
FIG. 5 is an alternate circuit diagram of the structure illustrated in FIG. 2.

FIG. 5 illustrates an alternate circuit diagram for the circuit illustrated in FIG. 4. Some of the advantages of the present base cell can be easily seen from discussing the operation of the circuit of FIG. 5. In particular, assume that the input voltage at the input is low. This will cause the voltage at points 200 and 202 to be respectively high and low. This condition will result in transistors T1a and T5a being off and transistor T2a being on. In this state, the output voltage is low. When the input voltage changes from a low to a high, the voltage at 200 goes high and somewhat thereafter the voltage at 202 goes low. This will cause transistors T1a and T5a to turn on and transistor T2a to turn off. Because the transistor T1a is an N-channel device and physically about the same size as the P-channel transistor T5a, it has the ability to quickly raise the voltage at the output to a level close to that of $V_{cc}$, i.e. to $V_{cc}-1$ volt. Thereafter, the transistor T5a will raise the output voltage to $V_{cc}$. Because both an N-channel and a P-channel transistor are operating in parallel, the output voltage is quickly raised from a low level to near its high level by the N-channel transistor and the P-channel completes the transition to the final high level at a slower rate. This performance is much better than using a P-channel transistor alone to pull up the voltage at the output when transitioning from a low to a high level voltage.

The circuit of FIG. 5 functions in the following manner when the input transitions from a high to a low voltage. When this occurs, the voltage at point 200 goes from a high to a low and somewhat thereafter, the voltage at 202 goes from a low to a high. This will cause transistor T1a and T5a to turn off and transistor T2a to turn on. When this occurs, transistor T2a will cause the output voltage to fall to near zero volts. Since transistor T2a is an N-channel device, this drop in voltage will be rapid as N-channel devices are very suitable for this task.

While the present invention has been illustrated with particular emphasis on the manner in which two base cells can be coupled together to form a flip-flop, the base cell configuration of FIG. 1, however, is far more flexible and can be utilized to produce numerous other types of circuit configurations including, but not limited to NANDs, NORs, ANDs, MIXERs and BUFFERs. Indeed, analysis suggests that a base cell configured as illustrated in FIG. 1 can be easily configured to perform a very large number of logic functions thereby making the base cell a highly useful one.

While the foregoing description has been made with particular emphasis on the embodiment of the invention as illustrated in the drawings, those of skill in the art will readily recognize that the invention may be modified in many ways, in addition to those already described, without departing from the spirit and scope of the present invention.

What is claimed is:

1. A CMOS base cell including a plurality of partially wired transistors for use in a gate array comprising, in combination:

a first plurality of N-channel transistors consisting of three series connected N-channel transistors, a first node being formed between the first and the second N-channel transistor and a second node being formed between the second and third N-channel transistor;

a first plurality of P-channel transistors consisting of two series connected P-channel transistors a third node being formed between the first and second P-channel transistor; and first connection means for connecting the gate of one said series connected P-channel transistor to the gate of said second and third N-channel transistor.

2. The CMOS cell of claim 1 wherein each said N-channel transistors has a current carrying capacity which is different from the current carrying capacity of each other N-channel transistor in the cell.

3. The CMOS cell of claim 2 wherein said P-channel transistors have a current carrying capacity of approximately ⅓ that of the N-channel transistor having the largest current carrying capacity.

4. The CMOS cell of claim 2 wherein one said series connected N-channel transistors has a current carrying capacity of approximately 60% the current carrying capacity the largest of said N-channel transistors.

5. The CMOS cell of claim 2 wherein one said series connected N-channel transistors has a current carrying capacity of approximately 20% the current carrying capacity the largest of said N-channel transistors.

6. A CMOS base cell including a plurality of partially wired transistors for use in a gate array comprising, in combination:

a first plurality of N-channel transistors consisting of three series connected N-channel transistors, a first node being formed between the first and the second N-channel transistor and a second node being formed between the second and third N-channel transistor, the current carrying capacity of each said N-channel transistor being different from the current carrying capacity of each other said N-channel transistor;

a first plurality of P-channel transistors consisting of two series connected P-channel transistors a third node being formed between the first and second P-channel transistor, the current carrying capacity of said P-channel transistors being substantially equal; and first connection means for connecting the gate of one said series connected P-channel transistor to the gate of said second and third N-channel transistor.

7. The CMOS cell of claim 6 wherein the current carrying capacity of one said N-channel transistor is about 20% of the current carrying capacity of said N-channel transistor with the highest current carrying capacity.

8. The CMOS cell of claim 6 wherein the current carrying capacity of one said N-channel transistor is about 60% of the current carrying capacity of said N-channel transistor with the highest current carrying capacity.

9. The CMOS cell of claim 6 wherein the current carrying capacity of said P-channel transistors is about ⅓ the current carrying capacity of said N-channel transistor with the highest current carrying capacity.

10. The CMOS cell of claim 1 additionally including a second CMOS cell of claim 1 and a plurality of wires interconnecting said first and second CMOS cell to form a flip-flop.

* * * * *